(12) United States Patent
Chen

(10) Patent No.: US 8,717,771 B2
(45) Date of Patent: May 6, 2014

(54) ELECTRONIC DEVICE

(75) Inventor: Hsiao-Chang Chen, Taipei (TW)

(73) Assignee: Inventec Corporation, Taipei (TW)

( * ) Notice: Subject to any disclaimer, the term of this patent is extended or adjusted under 35 U.S.C. 154(b) by 324 days.

(21) Appl. No.: 13/337,832

(22) Filed: Dec. 27, 2011

(65) Prior Publication Data

US 2013/0128479 A1 May 23, 2013

(30) Foreign Application Priority Data

Nov. 21, 2011 (CN) .......................... 2011 1 0370976

(51) Int. Cl.
- *H05K 5/00* (2006.01)
- *H05K 7/00* (2006.01)
- *B65D 6/28* (2006.01)
- *H02G 3/08* (2006.01)
- *G06F 1/16* (2006.01)

(52) U.S. Cl.
CPC ................ *G06F 1/16* (2013.01); *G06F 1/1607* (2013.01); *G06F 1/1632* (2013.01)
USPC . 361/759; 361/752; 361/679.41; 361/679.42; 361/679.43; 361/679.44; 220/4.02; 220/241; 220/242; 174/50; 174/66; 174/67

(58) Field of Classification Search
CPC ........ G06F 1/16; G06F 1/1607; G06F 1/1632
USPC ................................................ 361/752, 759
See application file for complete search history.

(56) References Cited

U.S. PATENT DOCUMENTS

| | | | |
|---|---|---|---|
| 6,749,465 B1* | 6/2004 | Huang et al. ................... | 439/630 |
| 6,760,217 B2* | 7/2004 | Tsai ........................... | 361/679.55 |
| 7,123,476 B2* | 10/2006 | Ke ............................ | 361/679.58 |
| 8,189,330 B2* | 5/2012 | Hung et al. .............. | 361/679.43 |
| 2005/0184210 A1* | 8/2005 | Ke ............................ | 248/346.01 |
| 2006/0104040 A1* | 5/2006 | Hsu ............................. | 361/752 |
| 2007/0177347 A1* | 8/2007 | Nishiyama .................... | 361/686 |
| 2008/0055844 A1* | 3/2008 | Kobayashi et al. ........... | 361/686 |
| 2009/0009957 A1* | 1/2009 | Crooijmans et al. .......... | 361/686 |
| 2010/0073862 A1* | 3/2010 | Carnevali ................. | 361/679.43 |
| 2010/0091446 A1* | 4/2010 | Kuo .......................... | 361/679.43 |
| 2012/0162902 A1* | 6/2012 | Zhou et al. ................ | 361/679.41 |

FOREIGN PATENT DOCUMENTS

| TW | 588869 | 5/2004 |
|---|---|---|
| TW | I341354 | 5/2011 |

\* cited by examiner

*Primary Examiner* — William H Mayo, III
*Assistant Examiner* — Rhadames J Alonzo Miller
(74) *Attorney, Agent, or Firm* — CKC & Partners Co., Ltd.

(57) ABSTRACT

An electronic device including a case, a covering plate, at least one first fixing unit, at least one second fixing unit, a circuit board disposed in the case, and a plurality of screwing members is provided. The case covered by the covering plate has a first datum surface and a second datum surface, where a distance between the covering plate and the first datum surface is greater than a distance between the covering plate and the second datum surface. The first and the second fixing units are disposed on the first and the second datum surfaces respectively. The first fixing unit includes a first screwing boss and at least one first rib adjacent thereto. The second fixing unit includes a second screwing boss and at least one second rib adjacent thereto. The screwing members pass through the covering plate and are screwed to the corresponding first and second screwing bosses.

9 Claims, 4 Drawing Sheets

ELECTRONIC DEVICE

CROSS-REFERENCE TO RELATED APPLICATION

This application claims the priority benefit of China application serial no. 201110370976.4, filed on Nov. 21, 2011. The entirety of the above-mentioned patent application is hereby incorporated by reference herein and made a part of this specification.

BACKGROUND OF THE INVENTION

1. Field of the Invention

The present invention generally relates to an electronic device, and in particular, to a docking station.

2. Description of Related Art

Since a notebook computer has the same functions as a common desktop computer and has a light and thin design to implement the portability for a user, the notebook computer becomes an indispensable portable tool for some users. In recent years, with the advance of sciences and technologies, the shapes and functions of the notebook computers are increasingly varied, and convenience and practicability make the notebook computers more popular and capable of being used for different purposes.

To enhance the usability, in addition to the functions built in the notebook computer, a docking station is further arranged to connect an external connection device such as a printer, a camera, a flash drive, an external hard disk, a network connector, a keyboard, and a mouse, so as to omit repeated actions of plugging in and out to enhance the usability. According to different use and volume limits, some docking stations may be disposed with more connection ports to provide more use functions.

Currently, for a common notebook computer, due to the problem of space disposition, screwing bosses for screwing screws have different specifications. For example, according to a requirement of whether a circuit board is disposed or not, screws used when the docking station is assembled have two lengths. However, in a situation that the circuit board is disposed, the screws need to pass through the circuit board to be screwed to the screwing bosses in the action of screwing. In this way, a distance passing through the circuit board needs to be considered in the design of the screw, that is, a length of this screw is greater than that of a screw used in a situation that the circuit board is not disposed. In another aspect, the above screws for assembling the docking station have different size specifications. In this way, when the docking station is assembled in a production line, different stations are required in the production line to screw screws with different specifications, which causes more trouble to the assembly in the production line. Moreover, in the assembly of the docking station, the screws with different specifications are required and cannot be shared, so a risk of screwing an incorrect screw may occur in the assembly.

SUMMARY OF THE INVENTION

Accordingly, the present invention is directed to an electronic device, in which screwing members have wider applicability.

The present invention provides an electronic device, including a case, a covering plate, at least one first fixing unit, at least one second fixing unit, a circuit board, and a plurality of screwing members. The case is covered by the covering plate. The case has a first datum surface and a second datum surface. A distance between the covering plate and the first datum surface is greater than a distance between the covering plate and the second datum surface. The first fixing unit is disposed on the first datum surface. The first fixing unit includes a first screwing boss and at least one first rib, and the first rib is adjacent to the first screwing boss. The second fixing unit includes a second screwing boss and at least one second rib, and the second rib is adjacent to the second screwing boss. The circuit board is disposed in the case. The screwing member pass through the covering plate and are screwed to the corresponding first and second screwing bosses to fix the circuit board in the case.

In an embodiment of the present invention, a support part is further included, which is disposed between the circuit board and the covering plate, so that the circuit board is pressed against at least one of the corresponding first screwing boss and second screwing boss by the support part.

In an embodiment of the present invention, a height of a top of the first screwing boss with respect to the first datum surface is greater than a height of a top of the first rib with respect to the first datum surface.

In an embodiment of the present invention, the circuit board includes a plurality of open holes, and an inner diameter of each open hole is greater than an outer diameter of the first screwing boss, so that a top of the first screwing boss is located in the corresponding open hole. A part of the circuit board around each open hole leans against the first rib.

In an embodiment of the present invention, the screwing member is a screw, and an outer diameter of a screw head of the screw is smaller than an inner diameter of the open hole, so that a pressing location of the support part by the screw head of the screw is in an orthogonal projection location of the open hole on the support part.

In an embodiment of the present invention, a height of a top of the first screwing boss with respect to the first datum surface is smaller than a height of a top of the circuit board with respect to the first datum surface.

In an embodiment of the present invention, the support part includes a body and a suppressing portion, and the circuit board is pressed between the suppressing portion and the first rib.

In an embodiment of the present invention, a height of the suppressing portion with respect to the first datum surface is smaller than a height of the body with respect to the first datum surface.

Based on above, in the embodiment of the present invention, the circuit board and the screwing member are not screwed directly because of the disposition of the open hole of the circuit board and the corresponding screwing bosses and ribs. Therefore, a thickness of the circuit board is not under consideration in the above process. In other words, the screwing members required in the production line to complete the assembly process are in the same specification so as to increase the production efficiency and yield.

In order to make the features and advantages of the present invention clearer and more comprehensible, the present invention is described in detail below with reference to embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
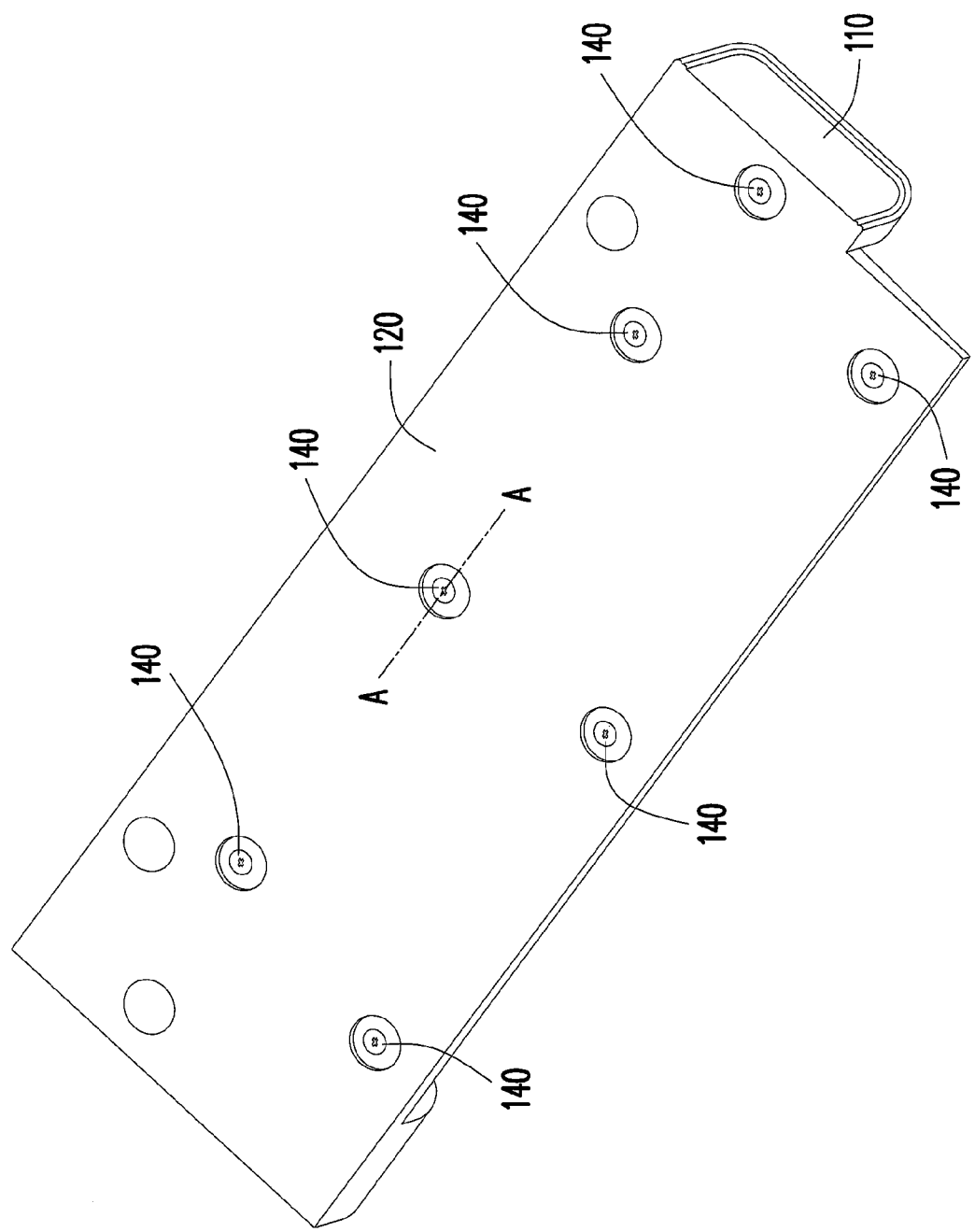
FIG. 1 is a schematic view of a docking station according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
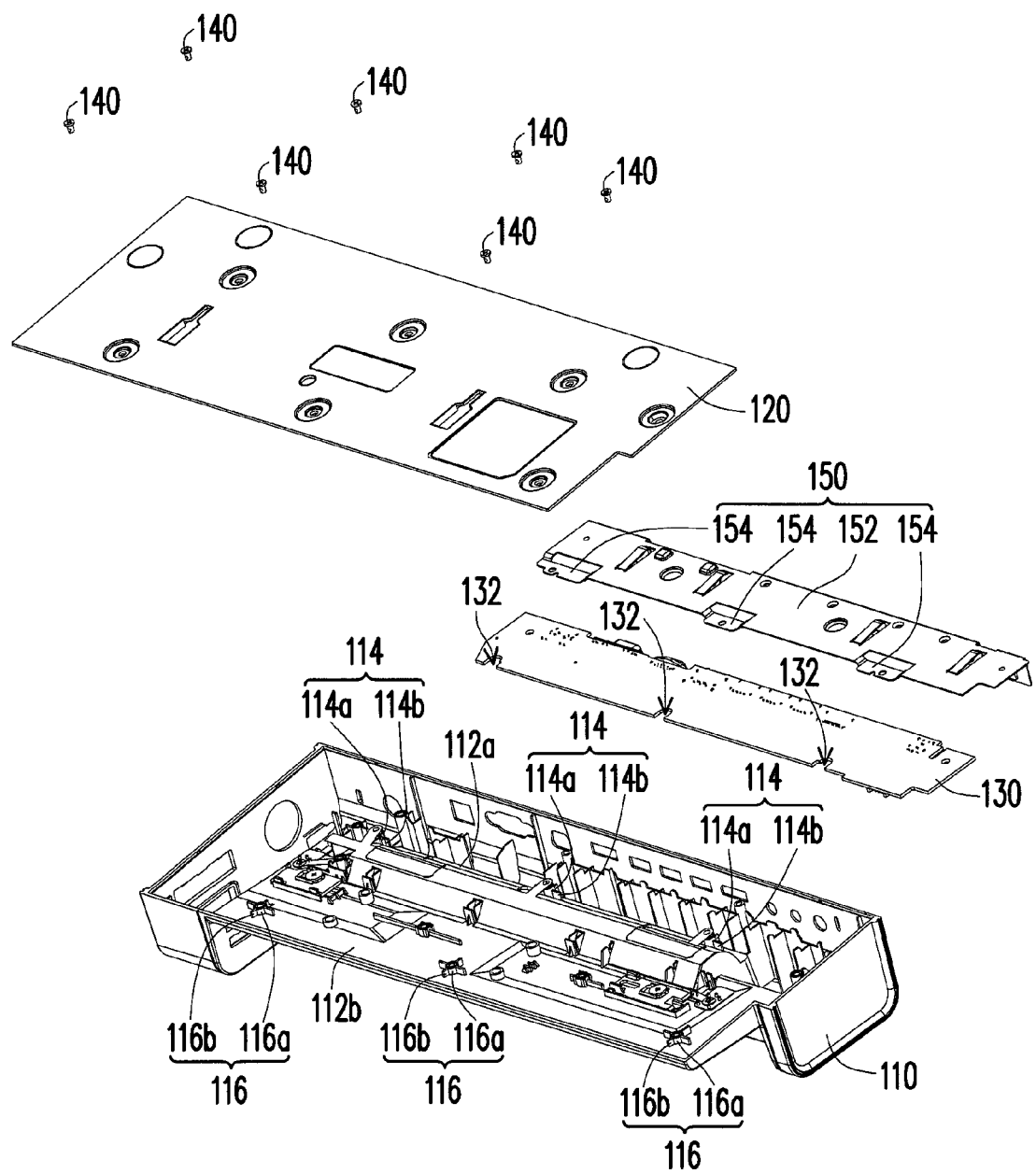
FIG. 2 is an exploded view of an electronic device in FIG. 1 with a view angle.
Figure 3:
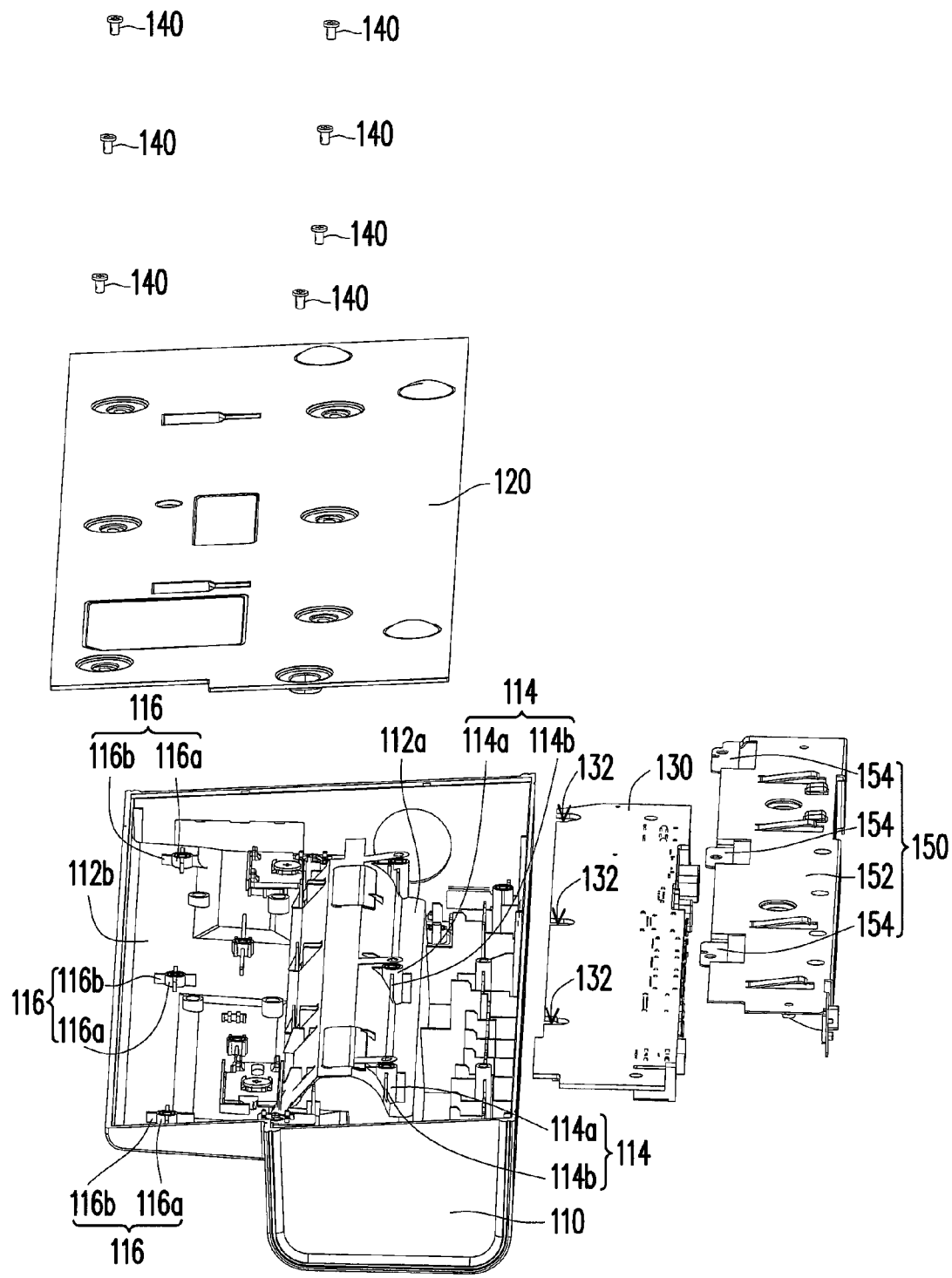
FIG. 3 is an exploded view of the electronic device in FIG. 1 with another view angle.

FIG. 1 is a schematic view of an electronic device according to an embodiment of the present invention. FIG. 2 and FIG. 3 are exploded views of a docking station in FIG. 1 with different view angles respectively, so as to clearly recognize an inner structure of a case. Referring to FIG. 1 to FIG. 3 at the same time, the electronic device 100 of this embodiment is, for example, a docking station, which is used as a device platform of implementing docking functions of a notebook computer, but the present invention is not limited thereto. In this embodiment, the electronic device 100 includes a case 110, a covering plate 120, a circuit board 130, a plurality of screwing members 140, a plurality of first fixing units 114, and a plurality of second fixing units 116. Furthermore, a relevant external device (for example, the notebook computer, not shown) borne on the electronic device 100 can be seen in the prior art and will not be described here again.

In this embodiment, the circuit board 130 is disposed in the case 110, and the covering plate 120 covers the case 110. The case 110 has a first datum surface 112a and a second datum surface 112b, where a distance between the covering plate 120 and the first datum surface 112a is greater than a distance between the covering plate 120 and the second datum surface 112b. That is to say, the first datum surface 112a is farther away from the covering plate 120 than the second datum surface 112b, so that the extra distance may accommodate relevant means such as the circuit board 130, that is, the circuit board 130 in this embodiment is disposed in a space above the first datum surface 112a.

The first fixing units 114 are disposed on the first datum surface 112a. Each first fixing unit 114 has a first screwing boss 114a and a plurality of first ribs 114b, and the first ribs 114b are adjacent to the first screwing boss 114a. The second fixing units 116 are disposed on the second datum surface 112b. Each second fixing unit 116 has a second screwing boss 116a and a plurality of second ribs 116b, and the second ribs 116b are adjacent to the second screwing boss 116a.

For a space in the case 110 and above the second datum surface 112b, the screwing member 140 is, for example, a screw, which passes through the covering plate 120 to be screwed to the second screwing boss 116a, so that the covering plate 120 leans against the second rib 116b and is fixed with the case 110.

For a space in the case 110 and above the first datum surface 112a, since a fixing effect of the circuit board 130 needs to be considered, the electronic device 100 of this embodiment further includes a support part 150 located between the covering plate 120 and the circuit board 130, and the circuit board 130 includes a plurality of open holes 132. The screwing member 140 passes through the covering plate 120, the support part 150, and the open holes 132 of the circuit board 130 in sequence and is screwed to the first screwing boss 114a. With this disposition, the circuit board 130 is fixed in the space above the first datum surface 112a by using the covering plate 120, the support part 150, and the screwing member 140.

Figure 4:
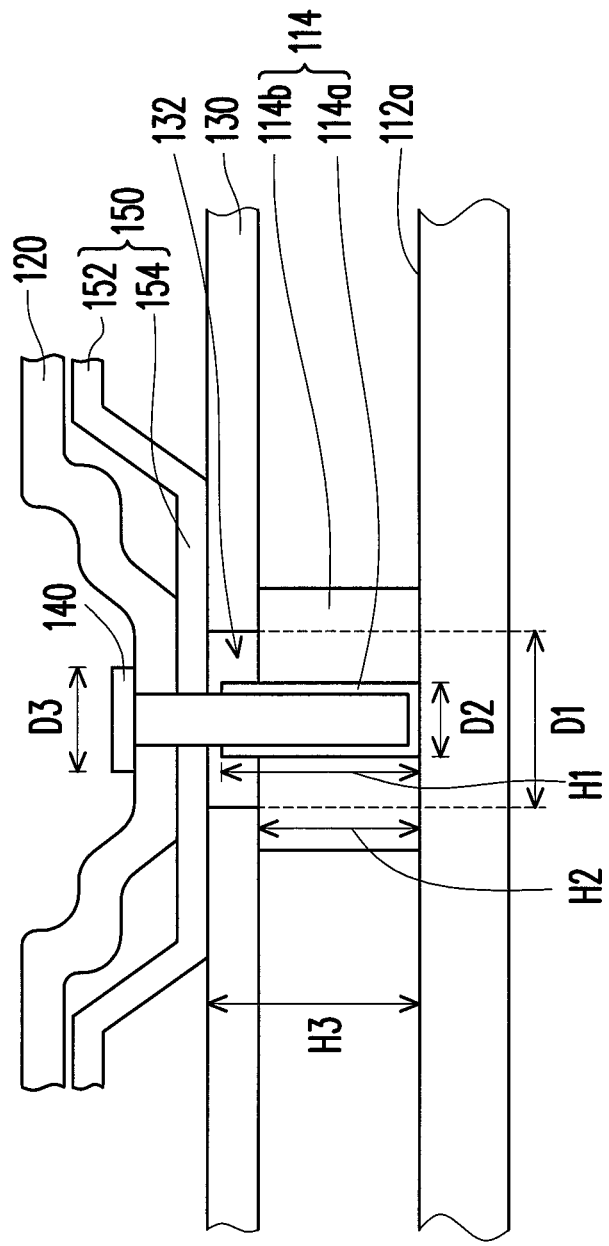
FIG. 4 is a sectional view of the electronic device in FIG. 1 along Line A-A.

FIG. 4 is a schematic sectional view of the docking station in FIG. 1 along Line A-A. Referring to FIG. 4, a height H1 of a top of the first screwing boss 114a with respect to the first datum surface 112a is greater than a height H2 of a top of the first rib 114b with respect to the first datum surface 112a, and the height H1 of a top of the first screwing boss 114a with respect to the first datum surface 112a is smaller than a height H3 of a top of the circuit board 130 with respect to the first datum surface 112a. Accordingly, the top of the first rib 114b leans against the circuit board 130, and the support part 150 leans against the circuit board 130, that is, the circuit board 130 is clamped between the support part 150 and the first rib 114b.

Furthermore, the support part 150 has a body 152 and a suppressing portion 154. The suppressing portion 154 is a sinking structure with respect to the body 152, so a height of the suppressing portion 154 with respect to the first datum surface 112a is smaller than a height of the body 152 with respect to the first datum surface 112a.

An outer diameter D3 of a screw head of the screwing member 140 is smaller than an inner diameter D1 of the open hole 132, and the inner diameter D1 of the open hole 132 is greater than an outer diameter D2 of the first screwing boss 114a. In other words, a pressing location of the support part by the screw head of the screwing member 140 is in an orthogonal projection location of the open hole 132 on the support part 150, that is, an orthogonal projection of the screwing member 140 on the first datum surface 112a is located in a range of an orthogonal projection of the open hole 132 on the first datum surface 112a.

When the screwing member 140 is screwed to the first screwing boss 114a, the screw head of the screwing member 140 presses against the covering plate 120, and the covering plate 120 presses against the suppressing portion 154, so that the circuit board 130 is pressed between the suppressing portion 154 and the first rib 114b. As such, a clamping force applied by the suppressing portion 154 to the circuit board 130 can be enhanced through a moment generated when the screwing member 140 is screwed.

Since the first screwing boss 114a passes through the open hole 132 of the circuit board 130 (that is, the top of the first screwing boss 114a is located in the open hole 132), although a screw relationship does not exist between the circuit board 130 and the screwing member 140, a screw length of the screwing member 140 does not need to be increased. That is to say, in the selection of a specification of the screwing member 140, a screw distance on the screwing member 140 does not need to be considered due to a thickness of the circuit board 130. In this way, a length of the screwing member 140 can be effectively reduced, and the screwing members 140 with the same specification (for example, the same screw length) are applicable to screwing at both the first datum surface 112a and the second datum surface 112b.

To sum up, in the embodiment of the present invention, with the disposition of the support part, the open hole of the circuit board, and the corresponding screwing bosses and ribs, after the screwing members are screwed to the screwing bosses, the circuit board is pressed between the support part and the ribs, so in the selection of the specification of the screwing members, a thickness of the circuit board does not need to be considered, thereby improving the applicability of the screwing member. In other words, when the electronic device is assembled, only the screwing members with the same specification are required in the production line to complete the assembly process of relevant means, thereby increasing the production efficiency and yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising:
    a covering plate;
    a case, covered by the covering plate and comprising a first datum surface and a second datum surface, wherein a distance between the covering plate and the first datum surface is greater than a distance between the covering plate and the second datum surface;
    at least one first fixing unit, disposed on the first datum surface, wherein the first fixing unit comprises a first screwing boss and at least one first rib, and the first rib is adjacent to the first screwing boss;
    at least one second fixing unit, disposed on the second datum surface, wherein the second fixing unit comprises a second screwing boss and at least one second rib, and the second rib is adjacent to the second screwing boss;
    a circuit board, disposed in the case; and
    a plurality of screwing members, passing through the covering plate to fix the circuit board in the case, wherein the screwing members are screwed to the corresponding first screwing boss and second screwing boss.

2. The electronic device according to claim 1, further comprising a support part, disposed between the circuit board and the covering plate, so that the circuit board is pressed against at least one of the corresponding first screwing boss and second screwing boss by the support part.

3. The electronic device according to claim 1, wherein a height of a top of the first screwing boss with respect to the first datum surface is greater than a height of a top of the first rib with respect to the first datum surface.

4. The electronic device according to claim 2, wherein the circuit board comprises a plurality of open holes, and an inner diameter of each open hole is greater than an outer diameter of the first screwing boss, so that a top of the first screwing boss is located in the open hole, and a part of the circuit board around the open hole leans against the first rib.

5. The electronic device according to claim 4, wherein the screwing member is a screw, and an outer diameter of a screw head of the screw is smaller than an inner diameter of the open hole, so that a pressing location of the support part by the screw head of the screw is in an orthogonal projection location of the open hole on the support part.

6. The electronic device according to claim 1, wherein a height of a top of the first screwing boss with respect to the first datum surface is smaller than a height of a top of the circuit board with respect to the first datum surface.

7. The electronic device according to claim 2, wherein the support part comprises a body and a suppressing portion, and the circuit board is pressed between the suppressing portion and the first rib.

8. The electronic device according to claim 7, wherein a height of the suppressing portion with respect to the first datum surface is smaller than a height of the body with respect to the first datum surface.

9. The electronic device according to claim 1, wherein a part of the screwing members screwed to the first screwing bosses and a part of the screwing members screwed to the second screwing bosses have the same specification.

* * * * *